United States Patent [19]

Pearson et al.

[11] Patent Number: 5,160,574

[45] Date of Patent: Nov. 3, 1992

[54] PROCESS FOR PRODUCTION OF SMALL DIAMETER TITANIUM CARBIDE WHISKERS

[75] Inventors: Alan Pearson, Murrysville; Michael A. Easley, Arnold, both of Pa.

[73] Assignee: Aluminum Company of America, Pittsburgh, Pa.

[21] Appl. No.: 707,659

[22] Filed: May 30, 1991

[51] Int. Cl.$^5$ .................. C01B 31/30; C30B 25/00
[52] U.S. Cl. .................. 156/613; 156/DIG. 112; 423/266; 423/440; 427/249
[58] Field of Search .............. 423/440, 439, 266; 501/87, 95; 51/307; 427/249; 156/DIG. 112, 613, 610

[56] References Cited

U.S. PATENT DOCUMENTS

| | | | |
|---|---|---|---|
| 3,437,443 | 4/1969 | Hertl | 423/440 |
| 3,761,576 | 9/1973 | Groening | 423/440 |
| 4,756,791 | 7/1988 | D'Angelo et al. | 423/440 |
| 4,900,525 | 2/1990 | D'Angelo et al. | 156/DIG. 112 |
| 5,094,711 | 3/1992 | Narasimhan et al. | 156/613 |

FOREIGN PATENT DOCUMENTS

| | | | |
|---|---|---|---|
| 60700 | 4/1983 | Japan | 423/440 |
| 59-45638 | 11/1984 | Japan | |
| 60-137871 | 7/1985 | Japan | |
| 61-110734 | 5/1986 | Japan | |
| 62-065921 | 3/1987 | Japan | 423/440 |
| 90-14451 | 11/1990 | PCT Int'l Appl. | 156/DIG. 112 |

OTHER PUBLICATIONS

Higashi et al, "Crystal Growth of Borides and Carbides of Transition Metals from Molten Aluminum Solutions", J. Crystal Growth, 33(1976) 207–211.

Kadota et al "Growth of Titanium Carbide Whiskers and Measurements of Their Mechanical Properties", Gov't Ind. Research Ins. Osaka, 1248–1253.

Kato et al, "Growth Rate of Titanium Carbide Whiskers in Chemical Vapor Deposition", J. Crystal Growth, 37(1977) 293–300.

Kato et al, "Some Common Aspects of the Growth of TiN, ZrN, TiC and ZrC Whiskers in Chemical Vapor Deposition", J. Crystal Growth 49(1980) 199–203.

Tamari et al, "Catalytic Effects of Various Metals and Refractory Oxides on the Growth of TiC Whiskers by Chemical Vapor Deposition", J. Crystal Growth 46(1979) 221–237.

Wokulski et al, "On the Growth and Morphology of TiC$_x$ Whiskers" J. Crystal Growth 62 (1983) 439–446.

Wokulski, "The Influence of Nickel on VLS Growth and Real Structure of TiC Whiskers", J. Crystal Growth 82 (1987) 427–434.

*Primary Examiner*—Michael Lewis
*Assistant Examiner*—Stephen G. Kalinchak
*Attorney, Agent, or Firm*—Andrew Alexander; David W. Pearce-Smith

[57] ABSTRACT

A method of producing small diameter titanium carbide whiskers is disclosed. The method comprises supplying a source of materials comprised of titanium halide, hydrocarbon gas and nickel and reacting this material in the presence of a source of carbon monoxide to produce small diameter titanium carbide whiskers.

16 Claims, No Drawings

PROCESS FOR PRODUCTION OF SMALL DIAMETER TITANIUM CARBIDE WHISKERS

BACKGROUND OF THE INVENTION

1. Field of the Invention

This invention relates to titanium carbide whiskers, and more particularly, it relates to an improved process for producing titanium carbide whiskers.

2. Description of the Related Art

In related art, there is disclosed different method of producing titanium carbide whiskers. For example, German Patentschrift 111550 discloses forming titanium carbide whiskers from a heterogeneous alloy which is melted and caused to solidify using directional solidification techniques to form the whiskers. After formation of the whiskers, the matrix is dissolved to recover the whiskers.

Japanese Patent Document 59-45638 discloses the formation of titanium carbide whiskers by first dipping a carbonaceous base in an aqueous solution of a noble metal such as platinum chloride and then drying the base. The base material is then heated in an atmosphere of hydrogen and a mixed gas of a volatile titanium halide and CO is supplied to deposit and grow the titanium carbide whiskers on the surface of the base material.

Higashi et al, in "Crystal Growth of Borides and Carbides of Transition Metals from Molten Aluminum Solutions", disclose the growth of single crystals of borides and carbides of Group IVA, VA, VIA metals and Mn (Group VIIA) using a molten aluminum solvent.

Kadota et al, in "Growth of Titanium Carbide Whiskers and Measurements of their Mechanical Properties", describes the growth of titanium carbide whiskers on a graphite substrate at 1250° C. by CVD using $TiCl_4$, CO, and $H_2$.

Kato et al, in "Growth Rate of Titanium Carbide Whiskers in Chemical Vapor Deposition", teach the growth of titanium carbide whiskers from a $TiCl_4$-$H_2$-$CH_4$ system using graphite plates and mullite tubes as the substrates. The authors state that polyhedral microcrystallites were deposited when graphite was used as the substrate but that the titanium carbide whiskers grew when a mullite tube was used as the substrate.

Kato et al, in "Some Common Aspects of the Growth of TiN, ZrN, TiC, and ZrC Whiskers in Chemical Vapor Deposition", discuss the effect of substrate on crystal growth of TiN, ZrN, TiC, and ZrC whiskers and the morphology and growth process of these whiskers.

Tamari et al, in "Catalytic Effects of Various Metals and Refractory Oxides on the Growth of TiC Whiskers by Chemical Vapor Deposition", describe the growth of TiC whiskers from the $TiCl_4$-$H_2$-$CH_4$ system on various substrates including metals and metal oxides, including temperature effects and direction of whisker growth on particular substrates.

Wokulski et al, in "On the Growth and Morphology of $TiC_x$ Whiskers", disclose various growth conditions for growing TiC whiskers including mole ratios of Ti to C and temperature. The morphology, stoichiometry, and structure of the resulting whiskers is also discussed.

Wokulski et al, in "The Influence of Nickel on VLS Growth and Real Structure of TiC Whiskers", describe the use of nickel in a vapor-liquid-solid (VLS) mechanism to form titanium carbide whiskers in which liquid Ni-Ti-C alloy is formed from which the TiC whiskers grow.

The use of titanium carbide whiskers as reinforcement in carbonaceous material for industrial use is described in Hitachi Japanese patent J60137871 which discloses a carbonaceous material containing needle crystals of SiC, TiC, $B_4C$, and/or $CaSiO_3$. Titanium carbide whiskers have also been used in the formation of lightweight titanium composite materials for aerospace as described by Saito in Japanese patent J6110734 wherein titanium powder and/or alloy is surface oxidized to form titanium oxide film on the particles which are then mixed with carbon and heated in air so that the film of titanium oxide is carburised to form titanium carbide whiskers.

However, there is still a great need for providing a method for controlling the growth and size of the TiC whiskers. The present invention fulfills that need by providing a process for producing TiC which is effective in providing TiC whiskers having very small diameter, e.g., 1 to 2 micrometers or less.

SUMMARY OF THE INVENTION

It is an object of the invention to provide TiC whiskers.

A further object of the invention is to provide small diameter TiC whiskers.

And yet a further object of the invention is to provide a method for producing small diameter TiC whiskers.

These and other objects will become apparent from the specification, figures and claims appended hereto.

In accordance with these objects, there is described a method of producing small diameter titanium carbide whiskers. The method comprises supplying a source of materials comprised of titanium halide, hydrocarbon gas and nickel and reacting this material in the presence of a source of carbon monoxide to produce small diameter titanium carbide whiskers.

DETAILED DESCRIPTION OF THE PREFERRED EMBODIMENT

This invention provides a method for producing small diameter titanium carbide whiskers. The method uses the vapor-liquid-solid procedure wherein the whiskers are grown on nickel or a nickel-coated substrate in a sealed reaction vessel. The substrate may be graphite coated with nickel, for example. The reaction vessel also contains a heating element. For purposes of operation, the vessel is first purged with argon gas. Thereafter, hydrogen is continuously flowed into the vessel which is then heated to an operating temperature in the range of 1100° to 1250° C. Upon reaching operating temperature, reactant gases, which may be mixed external to the vessel, are then directed into the vessel. The reaction vessel is preferably kept at a pressure of slightly above 1 atmosphere and in the range of about 1 to 2 atmospheres. However, the reaction can be operated under lower than atmospheric pressure.

The reaction gas contains a source of titanium halide, preferably titanium chloride, and a source of hydrocarbon gas, preferably methane. The reactants are present in an amount which promotes whisker growth. The following illustrates the reaction:

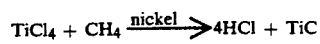

$$TiCl_4 + CH_4 \xrightarrow{nickel} 4HCl + TiC$$

It will be appreciated that an intermediary is formed comprised of Ti, C and Ni, and this forms an alloy. However, the chemistry surrounding the intermediary is not clearly understood, and papers have been written speculating about the exact chemistry involved. The nickel or nickel-coated carbon provides a catalyst for promotion of the reaction.

For purposes of the reaction, the gas introduced to the reaction vessel should contain about 1 part $TiCl_4$ to 1 part methane. This may be combined with about 12 parts argon and 86 parts hydrogen. The argon gas is used to protect the heating elements and to provide a carrier gas for $TiCl_4$. The reaction can be carried out at a temperature of 1100 to 1250° C., as noted earlier. The mole ratio of carbon to titanium in the reaction gases should be maintained in the ratio of about 0.3:1 to 3:1, preferably 0.8:1 to 1.2:1 and hydrocarbon to hydrogen in the range of 1:5 to 1:500. The flow rate of gases in the reactor is about 15 cm/sec (superficial velocity at reaction temperature) but can range from 3 to 75 cm/sec. The reaction time or time for whisker growth is in the range of about ¼ hour to 8 hours with typical reaction times being about 1 hour. The reaction is more completely described in an article by N. Tamari and A. Kato entitled "Catalytic Effects of Various Metals and Refractory Oxides on the Growth of TiC Whiskers by Chemical Vapor Deposition", *J. Crystal Growth*, 46 (1979), pp. 221-237, incorporated herein by reference.

In carrying out the reaction, it was noted that TiC begins to form initially in the shape of small crystals which cover the substrate. As the reaction continues, crystals growing perpendicular to the substrate surface grow faster.

In accordance with the invention, there is provided in the reactants a source of carbon monoxide to control the size of the TiC whiskers. That is, it was discovered that if a source of carbon monoxide was introduced with the reactants to the reaction vessel, the TiC whisker growth could be controlled to produce smaller diameter whiskers. Thus, the amount of carbon monoxide in reactant gases can range from 0.05 to 5 vol.% with higher amounts not known to be detrimental. Preferably, the amount of CO is in the range of 0.1 to 2.5 vol.%. When high amounts of CO are used, it is important that the methane or hydrocarbon gas be maintained. That is, total substitution of the CO for methane as a source of carbon in the reaction can result in poor whisker growth. Thus, it is preferred that the CO used be in an amount not more than half the amount of hydrocarbon based on the amount of carbon in each. Further, it is preferred that the CO be substituted partially for the amount of hydrocarbon used based on carbon. The amount of CO used can be up to half the amount of hydrocarbon used. For example, if the volume percent of methane in the reactive gas is 1.2 vol.%, then the volume percent of CO in the reactive gas can be up to 0.6 vol.% for best results as presently understood.

Accordingly, an advantage of the invention resides in the fact that whiskers less than 2 $\mu$m diameter, and typically less than 1 $\mu$m diameter, can be obtained.

In ceramic matrix/whisker reinforced composites, the toughening effect is believed to be due to interaction of the whisker with crack propagation. When a ceramic is stressed beyond some critical point, a crack is formed and propagates through the structure until failure occurs or the stress is removed. With brittle material such as monolithic (unreinforced) ceramics, this crack propagation occurs very rapidly after the critical stress has been exceeded.

If whiskers are added to the ceramic material, cracks tend to be deflected by the weak interface between whisker and matrix making it much more difficult for the crack to propagate to failure. This toughening mechanism is very dependent upon the microstructure of the composite and is favored by small grain size (for strength) and small whisker diameter.

Decreasing the whisker diameter has a beneficial effect on both grain size and toughness of the ceramic product. At a given whisker loading, the number of whiskers increases rapidly as whisker diameter is reduced so average distance between whiskers is also reduced. Closer spacing and larger numbers of whiskers help to retard grain growth in the sintering step, and in the finished ceramic, these factors increase the probability that a crack will interact with a whisker before undesirable propagation occurs.

The following examples will serve to further illustrate the practice of the invention.

EXAMPLE 1

This example shows the effects of various operating parameters on the diameter of TiC whiskers without CO addition. In all cases, hydrogen and argon flows to the furnace were 4 and 0.5 L/min., respectively. $TiCl_4$ and $CH_4$ concentrations are given in the tables.

Table 1 shows a set of data in which the operating temperature was varied from 1100° to 1250° C. and reaction time was held constant at 1 hour. C/Ti mole ratio in the inlet gas is provided also. At the lowest temperature, 1100° C., the whisker diameter was smallest at about 1.5 microns, but the yield of whiskers was significantly lower, and most of the product appeared to be particulate material rather than whiskers. At the highest temperature, 1250° C., the product was a particulate coating and no whiskers were observed. In the intermediate temperature range, the products were mostly whiskers with average sizes of 2 to 3 microns. Run 316 produced the coarsest whiskers which may be the result of the high C/Ti ratio used in this test. These data indicate that in the range of temperatures where whiskers tend to form, the average diameter is not a strong function of operating temperature.

Table 2 shows similar data with the holding time ranging from 0.25 to 3 hours. At the shortest holding time, the product was mostly particulate with whiskers just beginning to form. The short whiskers appear to average about 2 microns in diameter in the very early stage of growth. After 3 hours, a much wider range of sizes was observed, and the median size was quite large. This is consistent with the VLS theory where the early stage of whisker growth is controlled by the metal catalyst (rapid material deposition at the whisker tip resulting in rapid increase in length) and subsequent growth is due to vapor-solid reaction (slower growth in the radial direction). This data indicates that very short holding time does not appear to favor formation of whiskers of the desired small diameter.

Table 3 shows data in which the main variable was the molar ratio of C/Ti in the inlet gas stream. Reaction time was constant at 1 hour. At a C/Ti ratio of 0.6, the product was a thin hard crust which, on microscopic observation, was found to be tightly packed whiskers of square cross section with average diameter of about 1.5 microns. Although the size was in the desired range, the whiskers could not be separated and were, therefore, not satisfactory for composite use. At higher C/Ti ratios, the whiskers tended to be larger in diameter. Whiskers produced in Run 304 had a very wide range of sizes with the average being about 3 microns.

EXAMPLE 2

This example shows the effect of adding a small amount of carbon monoxide to the reaction gas mixture. The apparatus and procedures were the same as described for Example 1 except for the addition of CO as indicated. Data for this example are shown in Table 2. In these examples, the total carbon added to the system is the sum of that contributed by $CH_4$ and CO.

The first five tests shown in Table 4 illustrate the effect of small amounts of CO added to the gas mix. Run 708 is shown for comparison. A comparison of Runs 708 and 706 shows that replacement of as little as 0.2% of the $CH_4$ with CO resulted in a dramatic reduction in whisker diameter. Increasing amounts of CO did not have much additional effect on size reduction although any small effect may have been masked by either higher $TiCl_4$ concentration or higher C/Ti ratio in some of the runs. In Run 623 where only CO was used as the carbon source, the whisker size was smaller but the whiskers were of poorer quality.

Runs 629, 616 and 701 show tests in which the main variable was reaction temperature. Also, in this series, the $CH_4$ concentration was lower than in the above series. In all three cases, the whisker diameters were well below 1 micron. FIG. 1 shows SEMs of whiskers from Runs 708 (blank) and 616 (CO added).

The last two entries in Table 4 show two tests run for extended time with CO addition.

TABLE 1

Effect of Temperature on TiC Whisker Growth

| | Reaction Conditions | | | | |
|---|---|---|---|---|---|
| | Temp. | Time | Reactants (vol. %) | | C/Ti |
| Run No. | °C. | (h) | $TiCl_4$ | $CH_4$ | CO | Mol. Ratio |
| 202 | 1250 | 1 | 1.0 | 1.0 | 0 | 1.0 |
| 708 | 1185 | 1 | 1.1 | 1.2 | 0 | 1.1 |
| 210 | 1170 | 1 | 1.3 | 1.6 | 0 | 1.2 |
| 316 | 1135 | 1 | 0.5 | 1.6 | 0 | 3.2 |
| 328 | 1130 | 1 | 0.9 | 1.6 | 0 | 1.8 |
| 219 | 1100 | 1 | 1.0 | 1.6 | 0 | 1.6 |

| | Product Description | | |
|---|---|---|---|
| | Diameter (μm) | | |
| Run No. | Avg. | Range | Notes |
| 202 | — | — | Particles - No Whiskers |
| 708 | 2 | 1–4 | Mostly Whiskers |
| 210 | 2 | 1.5–4 | Mostly Whiskers |
| 316 | 3 | 1–8 | Mostly Whiskers |
| 328 | 2 | 0.5–4 | Mostly Whiskers |
| 219 | 1.5 | 1–4 | Mixture of Whiskers/Particles Low "Yield" |

TABLE 2

Effect of Holding Time on TiC Whisker Growth

| | Reaction Conditions | | | | | |
|---|---|---|---|---|---|---|
| | Temp. | Time | Reactants (vol. %) | | | C/Ti |
| Run No. | °C. | (h) | $TiCl_4$ | $CH_4$ | CO | Mol. Ratio |
| 307 | 1170 | 0.25 | 0.6 | 1.6 | 0 | 2.7 |
| 210 | 1170 | 1 | 1.3 | 1.6 | 0 | 1.2 |
| 212 | 1170 | 3 | 1.0 | 1.6 | 0 | 1.6 |

| | Product Description | | |
|---|---|---|---|
| | Diameter (μm) | | |
| Run No. | Avg. | Range | Notes |
| 307 | 2 | 1–4 | Few Whiskers |
| 210 | 2 | 1.5–4 | Mostly Whiskers |
| 212 | 6 | 4–15 | Mostly Whiskers |

TABLE 3

Effect of C/Ti Ratio in Feed Stream on TiC Whisker Growth

| | Reaction Conditions | | | | | |
|---|---|---|---|---|---|---|
| | Temp. | Time | Reactants (vol. %) | | | C/Ti |
| Run No. | °C. | (h) | $TiCl_4$ | $CH_4$ | CO | Mol. Ratio |
| 304 | 1170 | 1 | 1.4 | 3.1 | 0 | 2.2 |
| 210 | 1170 | 1 | 1.3 | 1.6 | 0 | 1.2 |
| 708 | 1185 | 1 | 1.1 | 1.2 | 0 | 1.1 |
| 301 | 1170 | 1 | 1.4 | 0.9 | 0 | 0.6 |

| | Product Description | | |
|---|---|---|---|
| | Diameter (μm) | | |
| Run No. | Avg. | Range | Notes |
| 304 | 3 | 0.5–15 | Mostly Whiskers |
| 210 | 2 | 1.5–4 | Mostly Whiskers |
| 708 | 2 | 1–4 | Mostly Whiskers |
| 301 | 1.5 | | Tightly Packed, Square Whiskers, Very Tough Coating |

TABLE 4

Effect of CO Addition on TiC Whisker Growth

| | Reaction Conditions | | | | | |
|---|---|---|---|---|---|---|
| | Temp. | Time | Reactants (vol. %) | | | C/Ti |
| Run No. | °C. | (h) | $TiCl_4$ | $CH_4$ | CO | Mol. Ratio |
| 708 | 1185 | 1 | 1.1 | 1.2 | 0 | 1.1 |
| 706 | 1185 | 1 | 1.0 | 1.0 | 0.2 | 1.2 |
| 531 | 1190 | 1 | 1.1 | 1.2 | 0.4 | 1.5 |
| 627 | 1190 | 1 | 1.4 | 1.2 | 0.6 | 1.3 |
| 623 | 1185 | 1 | 1.4 | 0 | 1.4 | 1.0 |
| 629 | 1150 | 1 | 1.0 | 0.8 | 0.4 | 1.2 |
| 616 | 1180 | 1 | 1.1 | 0.8 | 0.4 | 1.1 |
| 701 | 1210 | 1 | 1.3 | 0.8 | 0.4 | 0.9 |
| 607 | 1185 | 2 | 1.0 | 1.2 | 0.4 | 1.6 |
| 621 | 1180 | 3 | 1.0 | 0.8 | 0.4 | 1.2 |

| | Product Description | | |
|---|---|---|---|
| | Diameter (μm) | | |
| Run No. | Avg. | Range | Notes |
| 708 | 2 | 1–4 | Mostly Whiskers |
| 706 | 1 | 0.5–1.5 | Mostly Whiskers |
| 531 | 1.5 | 1–3 | Mostly Whiskers |
| 627 | 1 | 0.5–2 | Mostly Whiskers |
| 623 | 0.5 | 0.25–1 | Intergrown, Poor Appearance |
| 629 | 0.3 | 0.1–0.5 | Whiskers |
| 616 | 0.4 | 0.25–0.75 | Whiskers |
| 701 | 0.3 | 0.1–0.5 | Whiskers |
| 607 | 2 | 1.5–3 | Whiskers |
| 621 | 2 | 1–4 | Whiskers |

Having thus described the invention, what is claimed is:

1. A method of producing titanium carbide whiskers comprising the steps of:
   (a) supplying a source of materials comprised of titanium halide, hydrocarbon gas and nickel; and
   (b) reacting said materials in the presence of a source of carbon monoxide to produce said titanium carbide whiskers.

2. The method in accordance with claim 1 wherein the reacting is carried out in a temperature range of 1100° to 1250° C.

3. The method in accordance with claim 1 wherein the reacting is carried out in a pressure range of 1–2 atmospheres.

4. The method in accordance with claim 1 wherein the titanium halide is titanium chloride.

5. The method in accordance with claim 1 wherein the hydrogen gas is methane.

6. The method in accordance with claim 1 wherein the materials are present in 1 part titanium halide and 1 part hydrocarbon.

7. The method in accordance with claim 1 wherein the mole ratio of carbon to titanium present is in the ratio of 0.3:1 to 3:1.

8. The method in accordance with claim 1 wherein the mole ratio of carbon to titanium present is in the ratio of 0.8:1 to 1.2:1.

9. The method in accordance with claim 1 wherein the titanium halide is in gaseous form.

10. The method in accordance with claim 1 wherein the reacting is performed for a time in the range of ¼ to 8 hours.

11. The method in accordance with claim 9 wherein the carbon monoxide is present in the reaction gases in an amount in the range of 0.05 to 5 vol.%.

12. The method in accordance with claim 9 wherein the carbon monoxide is present in the reaction gases in an amount in the range of 0.1 to 2.5 vol.%.

13. The method in accordance with claim 1 wherein the whiskers have a diameter of less than 1.5 $\mu$m.

14. The method in accordance with claim 1 wherein the whiskers have an average diameter of less than 1 $\mu$m.

15. A method of producing small diameter titanium carbide whiskers comprising the steps of:
  (a) supplying a source of materials comprised of titanium chloride gas, hydrocarbon gas and nickel, the ratio of carbon to titanium in the gases being present in the ratio of 0.3:1 to 3:1; and
  (b) reacting said materials at a temperature in the range of 1100° to 1250° C. and at a pressure in the range of 1 to 2 atmospheres in the presence of a source of carbon monoxide present in the gases in the range of 0.05 to 5 vol.% to produce titanium carbide whiskers.

16. The method in accordance with claim 15 wherein the whiskers have a diameter of less than 2 $\mu$m.

* * * * *